(12) United States Patent
Lee (10) Patent No.: US 12,501,761 B2
(45) Date of Patent: Dec. 16, 2025

(54) METHOD FOR MANUFACTURING PEROVSKITE SOLAR CELL MODULE ENCAPSULATED WITH SELF-CLEANING THIN FILM BY USING INKJET PRINTING, AND PEROVSKITE SOLAR CELL MODULE WITH SELF-CLEANING FUNCTION MANUFACTURED THEREBY

(71) Applicant: GOSANTECH CO., LTD., Cheonan-si (KR)

(72) Inventor: Jinyoung Lee, Cheonan-si (KR)

(73) Assignee: GOSANTECH CO., LTD., Cheonan-si (KR)

(*) Notice: Subject to any disclaimer, the term of this patent is extended or adjusted under 35 U.S.C. 154(b) by 184 days.

(21) Appl. No.: 18/450,042

(22) Filed: Aug. 15, 2023

(65) Prior Publication Data

US 2024/0206199 A1   Jun. 20, 2024

(30) Foreign Application Priority Data

Dec. 14, 2022  (KR) .......................... 10-2022-0174947

(51) Int. Cl.
*H10K 30/87* (2023.01)
*H10K 30/88* (2023.01)
(Continued)

(52) U.S. Cl.
CPC ............. *H10K 30/87* (2023.02); *H10K 30/88* (2023.02); *H10K 39/10* (2023.02); *H10K 71/441* (2023.02)

(58) Field of Classification Search
CPC .. G02B 3/0012; G02B 3/0006; G02B 3/0018; G02B 1/18; G02B 5/045; H10F 19/80;
(Continued)

(56) References Cited

U.S. PATENT DOCUMENTS

2010/0181901 A1* 7/2010 Douglas ............... G02B 3/0012
427/64
2013/0235434 A1   9/2013 Akiyama et al.
(Continued)

FOREIGN PATENT DOCUMENTS

CN   106273518 A * 1/2017 ............. B33Y 10/00
CN   115472637 A   12/2022
(Continued)

OTHER PUBLICATIONS

TW-201623000-A English machine translation (Year: 2016).*
(Continued)

*Primary Examiner* — Andrew J Golden
(74) *Attorney, Agent, or Firm* — Sughrue Mion, PLLC (57) ABSTRACT

Proposed is a method for manufacturing a perovskite solar cell module encapsulated with a self-cleaning thin film by using an inkjet printing process. The method includes a boundary line forming step and a micro lens forming step. The boundary line forming step is to form boundary lines on the surface of an organic or inorganic film surrounding a perovskite solar cell array by an inkjet printing process, and the micro lens forming step is to form a micro lens array on the surface of the organic or inorganic film surrounding the perovskite solar cell array such that each of the micro lenses is surrounded by the boundary line. The boundary line is first formed to demarcate regions corresponding to the respective micro lenses, and the micro lenses are then formed in the regions surrounded by the boundary line, so that micro lenses with a high aspect ratio are densely formed.

7 Claims, 7 Drawing Sheets

(51) Int. Cl.
*H10K 39/10* (2023.01)
*H10K 71/40* (2023.01)

(58) Field of Classification Search
CPC ... H10F 77/484; H10F 39/8063; H10K 30/87; H10K 30/88; H10K 30/50; H10K 30/352; H10K 30/35; H10K 30/30; H10K 85/1135; H10K 85/50; H10K 39/10; H10K 50/858
See application file for complete search history.

(56) References Cited

U.S. PATENT DOCUMENTS

| | | | |
|---|---|---|---|
| 2018/0351012 A1 | 12/2018 | Xue et al. | |
| 2019/0096590 A1* | 3/2019 | Lee | H10K 30/88 |
| 2022/0077412 A1* | 3/2022 | Yamamoto | H10K 30/88 |

FOREIGN PATENT DOCUMENTS

| | | | | | |
|---|---|---|---|---|---|
| JP | 2005103392 | A | * | 4/2005 | |
| JP | 2006-150751 | A | | 6/2006 | |
| JP | 2012-256782 | A | | 12/2012 | |
| KR | 10-0974016 | B1 | | 8/2010 | |
| KR | 2011119391 | A | * | 11/2011 | ........... G02B 3/0056 |
| KR | 10-2022-0134335 | A | | 10/2022 | |
| TW | 201623000 | A | * | 7/2016 | |
| WO | 2008/157604 | A1 | | 12/2008 | |

OTHER PUBLICATIONS

CN-106273518-A English machine translation (Year: 2017).*
KR-2011119391-A English machine translation (Year: 2011).*
JP-2005103392-A English machine translation (Year: 2005).*
Office Action dated Mar. 28, 2024 for KR patent application No. 10-2022-0174947 issued from Korean Intellectual Property Office.
Tavakoli, et al., "Highly Efficient Flexible Perovskite Solar Cells with Antireflection and Self-Cleaning Nanostructures", ACS NANO, 2015, vol. 9, No. 10, pp. 10287-10295 (9 pages).

* cited by examiner

METHOD FOR MANUFACTURING PEROVSKITE SOLAR CELL MODULE ENCAPSULATED WITH SELF-CLEANING THIN FILM BY USING INKJET PRINTING, AND PEROVSKITE SOLAR CELL MODULE WITH SELF-CLEANING FUNCTION MANUFACTURED THEREBY

CROSS REFERENCE TO RELATED APPLICATION

The present application claims priority to Korean Patent Application No. 10-2022-0174947, filed Dec. 14, 2022, the entire contents of which is incorporated herein for all purposes by this reference.

BACKGROUND OF THE INVENTION

1. Field of the Invention

The present disclosure relates to a method for manufacturing a solar cell module. More particularly, the present disclosure relates to a method for providing self-cleaning thin film encapsulation for a perovskite solar cell module by using inkjet printing when manufacturing the perovskite solar cell module and to a perovskite solar cell module manufactured thereby.

2. Description of the Related Art

Recently, the importance of developing next-generation clean energy has been increasing due to serious environmental pollution problems and fossil energy depletion. Among them, solar cells, which are devices that directly convert solar energy into electrical energy, are expected to be an energy source that can solve future energy problems because they generate less pollutants, use infinite resources, and have a semi-permanent lifespan.

Solar cells are composed of P-N junction diodes. The solar cells are categorized into various types depending on the material that forms P-N junctions and is used for a light-absorbing layer that absorbs and converts light into electricity. The most common are silicon solar cells using crystalline silicon. However, interest in thin-film solar cells is increasing because silicon is expected to be depleted and the price of silicon has skyrocketed. Since thin-film solar cells are made to be thinner than traditional solar cells, the thin-film solar cells use a less amount of material and are lightweight, thereby being used in a wider range of applications.

Recently, studies on perovskite solar cells have been active due to low manufacturing costs and rapid efficiency growth, achieving high power conversion efficiencies of up to 25% or more.

However, the commercialization of perovskite solar cells has been challenged by the fact that perovskite solar cells not only contain large amounts of lead (Pb), which is harmful to the human body, but also have a fatal problem of being extremely unstable when exposed to ultraviolet light and moisture.

As a strategy to solve the stability problem of perovskite solar cells, studies have been reported to fundamentally improve the stability by optimizing the composition of perovskite and device configuration or to prevent the infiltration of oxygen and moisture into the cells by encapsulating the cells with glass, but it is difficult to apply due to the complexity of the device fabrication process, which greatly increases the cost, as well as the decrease in efficiency caused by various factors. Therefore, research and studies have been conducted on thin film encapsulation (TFE), which utilizes organic and inorganic thin films for encapsulation rather than utilizing glass.

On the other hand, since solar cells are often used outdoors, solar cell modules are provided as modules having the form in which solar cells are encapsulated with a sealing material, so that the solar cells can withstand various outdoor environments such as dust particles or rainwater. When dust particles or rainwater are attached to the surface of solar cell modules, the power generation efficiency is significantly reduced.

In particular, as mentioned above, in the case of perovskite solar cell modules modularized with TFE using organic and inorganic thin films, the problem of surface contamination becomes serious due to the characteristics of organic and inorganic thin films, and technical complements are needed to solve the problem.

DOCUMENTS OF RELATED ART

Patent Literature (Patent Literature 1) Korean Patent Application Publication No. 10-2022-0134335

SUMMARY OF THE INVENTION

To solve the above-mentioned problems occurring in the related art, the present disclosure discloses a method for manufacturing a perovskite solar cell module encapsulated with a self-cleaning thin film, and a perovskite solar cell module with a self-cleaning function, manufactured by the method.

In a first aspect of the present disclosure, there is provided a method for manufacturing a perovskite solar cell module having self-cleaning function, the method including: an encapsulation process of coating an outer surface of a perovskite solar cell with an organic film, an inorganic film, or both; and a surface treatment process of forming a surface structure providing a self-cleaning effect on a surface of the organic or inorganic film surrounding the perovskite solar cell. The surface treatment process includes: a boundary line forming step of forming a boundary line through an inkjet printing process on the surface of the organic or inorganic film surrounding the perovskite solar cell; and a micro lens forming step of forming a micro lens through an inkjet printing process on the surface of the organic or inorganic film surrounding the perovskite solar cell, the micro lens being surrounded by the boundary line.

The boundary line and the micro lens may be made of one material among PDMS, PTFE, epoxy, and an acrylic polymer.

In the boundary line forming step, thermal reflow may be performed on the boundary line formed by needle inkjet printing so that the boundary line is processed to have a lens-shaped cross section.

In the boundary line forming step, the boundary line may be formed to have a lens-shaped cross section through inkjet printing using a needle-shaped nozzle.

The micro lens forming step may include: a primary inkjet printing step of ejecting a first ink into a region surrounded by the boundary line on the surface of the organic or inorganic film surrounding the perovskite solar cell; a preliminary drying step of drying the first ink ejected in the primary inkjet printing step; and a secondary inkjet printing step of ejecting a second ink onto the preliminarily dried ink.

The preliminary drying step may be performed such that no skin is formed on the surface of the first ink ejected in in the primary inkjet printing step.

A drying time in the preliminary drying step may be adjusted by adjusting a mixing ratio of a relatively high vapor-pressure solvent and a relatively low vapor-pressure solvent that are used in combination as a solvent of the first ink.

In another aspect of the present disclosure, there is provided a perovskite solar cell module having a self-cleaning function, the perovskite solar cell module being manufactured by the method described the former aspect of the present disclosure, the perovskite solar cell module including: one or more perovskite solar cells; an encapsulating member made of an organic film, an inorganic film, or both and surrounding the one or more perovskite solar cells; a boundary line formed by an inkjet printing process on a surface of the encapsulating member; and a micro lens formed by an inkjet printing process on the surface of the encapsulating member, the micro lens being surrounded by the boundary line.

The boundary line may have a lens-shaped cross section.

The encapsulating member may be a multilayer system in which an inorganic film, an organic film, and an inorganic film are stacked in this order.

According to the present disclosure, the boundary lines are formed first, and the micro lenses are then formed in respective regions, each region being surrounded by the boundary lines. Therefore, it is possible to form high aspect-ratio micro lenses that are highly densely arranged through inkjet printing.

DESCRIPTION OF THE PREFERRED EMBODIMENTS

Hereinafter, embodiments of the present invention will be described in detail with reference to the accompanying drawings.

However, embodiments of the present disclosure may be modified into many forms, and the scope of the present disclosure is not limited to the embodiments described below. The shapes and sizes of elements in the drawings may be exaggeratedly illustrated for clarity and convenience of description, and like elements are denoted by like reference numerals through the drawings.

It is to be understood in the following description that when one component is referred to as being "connected to", "combined with", or "coupled to" another component, it may include not only direct connection, but indirect connection with another component therebetween. It will be further understood that when a component "comprises" or "has" another component, it means that the component may further include another component, not excluding another component unless stated otherwise.

Terms used in the specification, "first", "second", etc. can be used to discriminate one component from another component, but the order or priority of the components is not limited unless specifically stated. Accordingly, a first component in an embodiment may be referred to as a second component in another element, and similarly, a second component in an embodiment may be referred to as a first component in another embodiment within the scope of the present disclosure.

A method for manufacturing a perovskite solar cell module encapsulated with a self-cleaning thin film, according to a first embodiment of the present disclosure, includes an encapsulation process and a surface treatment process.

The encapsulation process is a process of coating a perovskite solar cell with an organic or inorganic film for encapsulation.

The perovskite solar cells to be encapsulated may be commonly available perovskite solar cells, and they may be even perovskite solar cells vulnerable to moisture or oxygen. A perovskite solar cell module is composed of multiple perovskite solar cells. The multiple perovskite solar cells in one module may be electrically connected by a certain electrical connection method that is not particularly limited. Any existing electrical connection method may be used to connect solar cells in various types of solar cell modules, without departing from the features of the present disclosure.

The organic and inorganic films used to prevent moisture or oxygen from penetrating into perovskite solar cells that are vulnerable to moisture are not particularly limited, and any material used in thin film encapsulation (TFE) technology for perovskite solar cells can be used. For example, a multilayer organic/inorganic TFE system in which organic and inorganic films are alternately stacked, which has been recently widely used, can be applied. Especially, a multilayer organic/inorganic TFE system in which three films are laminated in the order of an inorganic film, an organic film, and an inorganic film, may be used.

The surface treatment process is to provide a surface roughness (concavo-convex structure) for self-cleaning, to the surface of the organic or inorganic film that encapsulates the perovskite solar cell.

In the present disclosure, the surface treatment process features that an inkjet printing process is used for improvement in process efficiency. Specifically, the surface treatment process is characterized in that the formation of boundary lines and the formation of micro lenses are sequentially performed using an inkjet printing process.

Figure 1:
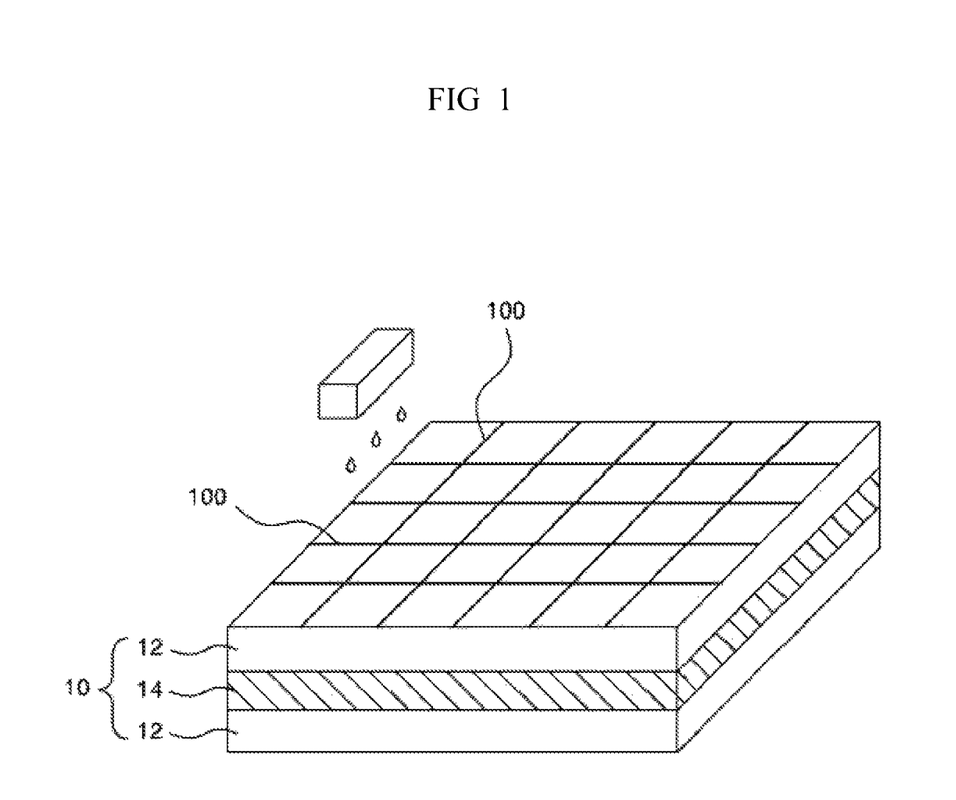
FIG. 1 is a diagram illustrating a boundary line forming step involved in a surface treatment process involved in a method of manufacturing a perovskite solar cell module encapsulated with a self-cleaning thin film, according to a first embodiment of the present disclosure.
Figure 2:
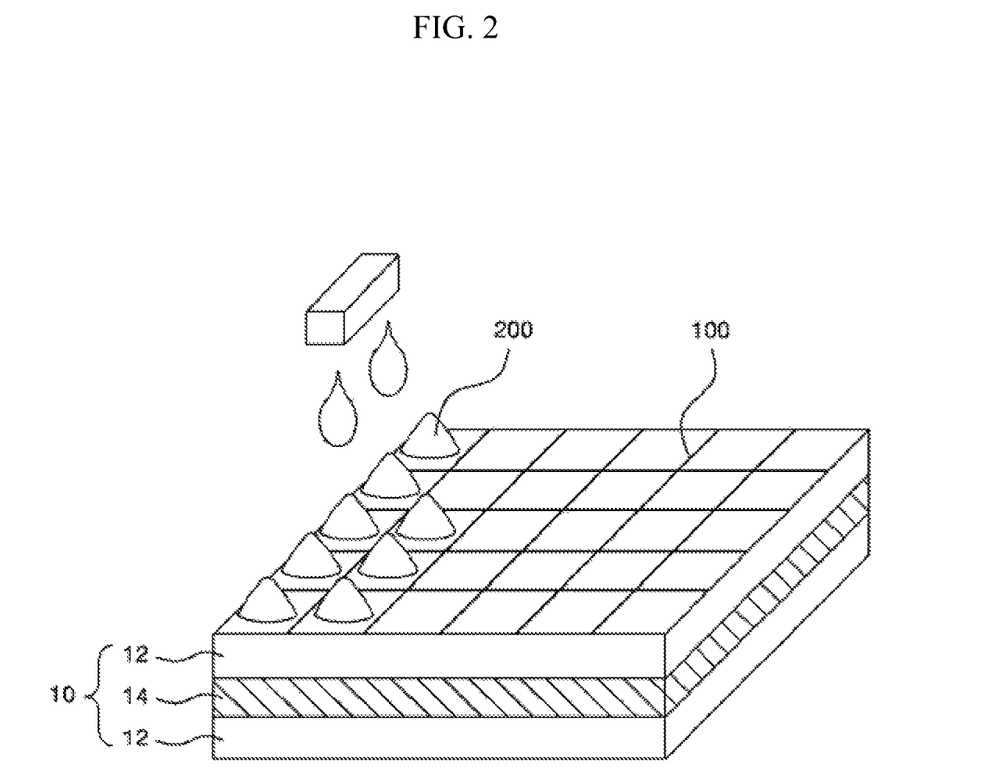
FIG. 2 is a diagram illustrating a micro lens forming step involved in the surface treatment process involved in the method of manufacturing a perovskite solar cell module encapsulated with a self-cleaning thin film, according to the first embodiment of the present disclosure.
Figure 3:
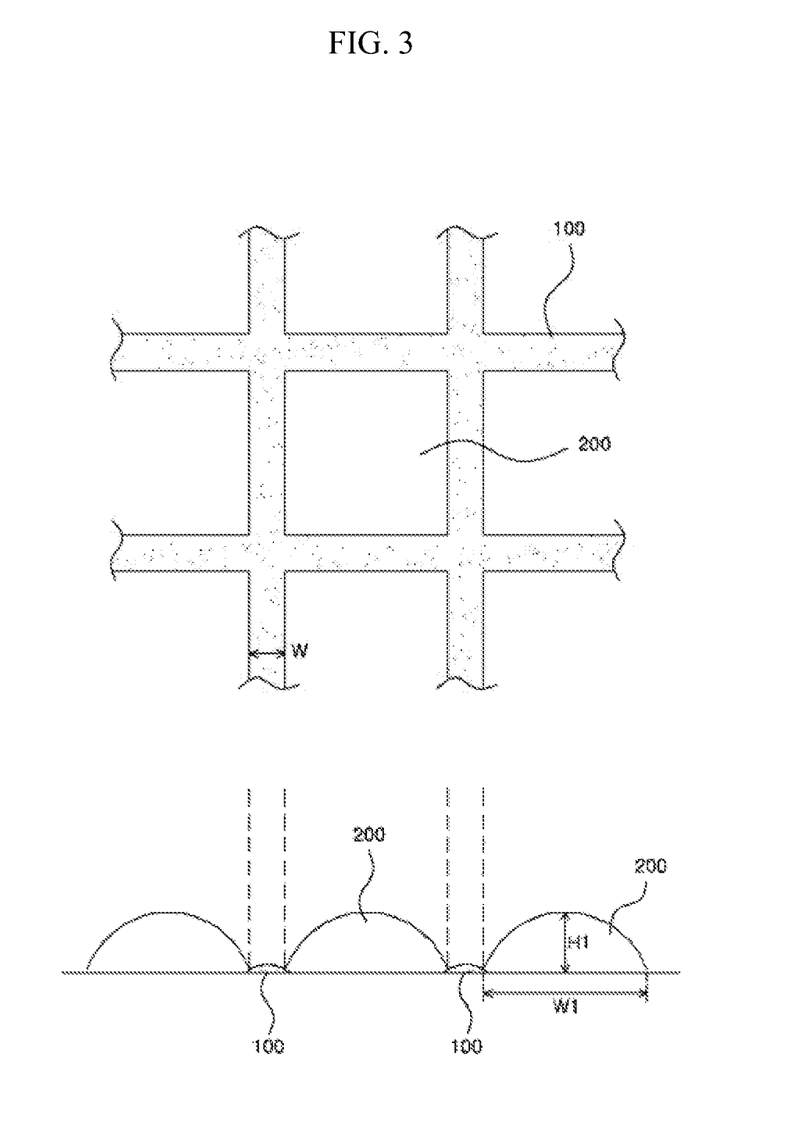
FIG. 3 is a diagram for explaining a surface structure formed through the surface treatment process involved in the method of manufacturing a perovskite solar cell module encapsulated with a self-cleaning thin film, according to the first embodiment of the present disclosure.

FIG. 1 is a diagram illustrating a boundary line forming step involved in a surface treatment process involved in a method of manufacturing a perovskite solar cell module encapsulated with a self-cleaning thin film, according to a first embodiment of the present disclosure, FIG. 2 is a diagram illustrating a micro lens forming step involved in the surface treatment process involved in the method of manufacturing a perovskite solar cell module encapsulated with a self-cleaning thin film, according to the first embodiment of the present disclosure, and FIG. 3 is a diagram for illustrating a surface structure formed by the surface treatment process involved in the method of manufacturing a perovskite solar cell module encapsulated with a self-cleaning thin film, according to the first embodiment of the present disclosure.

First, the boundary line forming step is performed to draw boundary lines 100, which are a pattern composed of thin lines, on the surface of an organic or inorganic film covering a perovskite solar cell, using a hydrophobic ink.

As illustrated in FIG. 1, a pattern is drawn by jetting "ink for forming boundary lines" (hereinafter, referred to as "a boundary line ink") to the surface of a multilayer organic/inorganic thin film encapsulation system 10 in which three films including two inorganic films 12 and one organic film 14 are stacked, by using an inkjet printing process. FIG. 1 illustrates a case where the boundary lines 100 demarcate square regions. However, the regions demarcated by the boundary lines 100 may not be limited thereto, and regions of various shapes that can be formed by inkjet printing may be surrounded by the boundary lines 100.

In this case, since the boundary lines 100 are formed from a hydrophobic ink, the boundary lines 100 can restrict the spreading of "ink for forming micro lenses" (hereinafter, referred to as a micro lens ink), thereby defining the boundary of each micro lens. Due to this point, a dense array of micro lenses can be formed. In addition, due to the hydrophobicity of the boundary lines 100, the micro lens ink has a large contact angle when coming into contact with the boundary lines 100. This results in an effect of increasing the aspect ratio of the ink filling the inside regions of the boundary lines 100. To this end, materials such as PDMS, PTFE, epoxy, and acrylic polymers, which are polymeric materials having low surface energy, may be used as an ink material for forming the boundary lines.

Next, a micro lens forming step is performed to form stereoscopic micro lenses 200. This step involves filling the regions surrounded by the boundary lines 100 drawn in the boundary line forming step, with "ink for micro lenses" (simply referred to as a micro lens ink).

As illustrated in FIG. 2, the regions surrounded by the boundary lines 100 drawn on the surface of the multilayer organic/inorganic TFE system 10 are filled with the micro lens ink through an inkjet printing process, and the jetted micro lens ink is then dried to form stereoscopic micro lenses 200.

Since the boundary lines 100 restrict the spreading of the ink, the formed micro lenses 200 have a three dimensional shape with a relatively small cross-sectional thickness at positions relatively near the boundary line 100 and a relatively large cross-sectional thickness at positions relatively far from the boundary line. In order for the boundary lines 100 to have the effect of restricting the spreading of the ink, the ink of the boundary lines 100 and the ink of the micro lenses must not be mixed. To this end, the micro lens forming step needs to be performed after the boundary line ink is sufficiently cured to the extent that the boundary line ink becomes immiscible with the micro lens ink that is subsequently applied. In the case where the boundary line ink and the micro lens ink are not miscible in their liquid phase due to the properties of the solvents of the respective inks, the micro lens forming step can be performed without a resting period, i.e., before the boundary line ink is completely dried. To maintain the separation between the micro lens ink and the boundary line ink, orthogonal solvents are used for the respective inks, or cross-linking materials may be mixed with the inks. On the other hand, as the contact angle of the micro lens ink with respect to the boundary lines is increased, the aspect ratio of the formed micro lenses increases. Therefore, polymeric material with low surface energy, such as PDMS, PTFE, epoxy, and acrylic polymers, can be used as a material for the micro lens ink.

The three-dimensional shape of the micro lenses 200 is intended to provide a surface e roughness (concavo-convex structure) to the surface of the multilayer organic/inorganic TFE system 10, and the surface roughness has the effect of preventing dust particles or rainwater from attaching to the surface of the multilayer organic/inorganic TFE system 10. As described above, with the construction in which the surface of the multilayer organic/inorganic TFE system 10 is provided with the micro lenses 200, the multilayer organic/inorganic TFE system 10 is imparted with a self-cleaning function that makes it difficult for dust particles or rainwater to attach to the surface of the perovskite solar cell module.

The effectiveness of the self-cleaning function provided by the micro lenses 200 formed on the surface varies depending on the aspect ratio and density of the micro lenses 200. In the present embodiment, a hydrophobic ink is first used to form boundary lines 100, and the regions demarcated by the boundary lines 100 are then filled with a micro lens ink to form micro lenses 200. With the use of this two-step process, the micro lenses 200 can be highly densely formed, and the formed micro lenses 200 have a high aspect ratio representing a ratio of height to width. That is, the encapsulation with good self-cleaning performance can be realized.

When the arrangement density and aspect ratio of the micro lenses 200 are increased, the reflection loss of light incident on the surface is reduced, and a wider incident angle range of light can be utilized, resulting in increase in power generation efficiency of a perovskite solar cell module. Therefore, it is important to increase the density and aspect ratio of the micro lenses 200 formed on the surface. In the present embodiment, as illustrated in FIG. 3, since the boundary lines 100 limits the area of each micro lens 200, the density of micro lenses 200 increases with decreasing width W of the boundary lines 100. In addition, since the width W1 of the micro lenses 200 is reduced and the height H1 of the micro lenses is increased, the aspect ratio of the micro lenses 200 increase. However, when the amount of the micro lens ink supplied to the inside region surrounded by the boundary lines 100 is excessive, there is a concern that the ink overflows the boundary lines 100. Therefore, it is necessary to control the width W of the boundary lines 100 and the amount of the ink supply, depending on the contact angle of the micro lens ink with respect to the boundary lines 100.

To explain the features and effects of the present disclosure, an inkjet printing technique of forming micro lenses without using boundary lines will be described as a comparative example.

Figure 4:
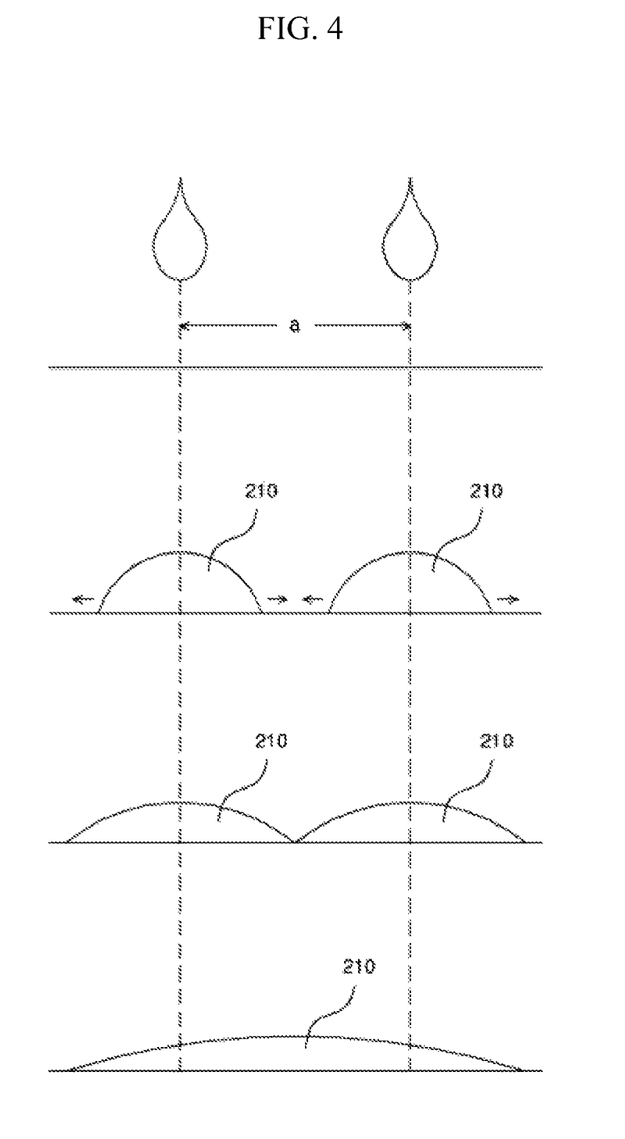
FIG. 4 is a diagram for explaining a problem with a method of forming micro lenses using an inkjet printing process without forming boundary lines according to a comparative example.
Figure 5:
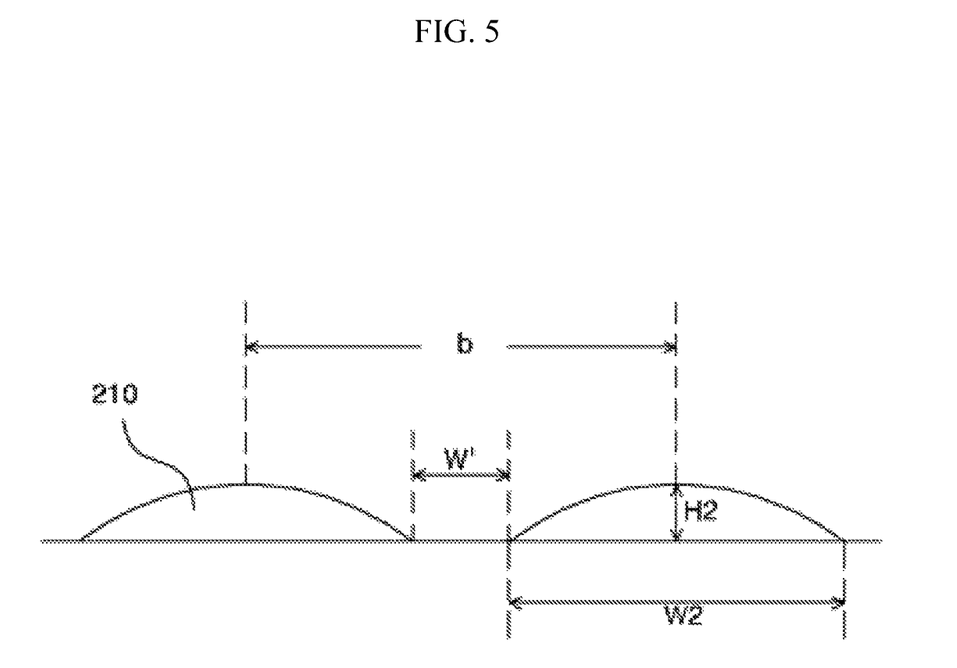
FIG. 5 is a diagram illustrating design settings for solving the problem of the method according to the comparative example.

FIG. 4 is a diagram for explaining a problem with the comparative example, and FIG. 5 is a diagram illustrating design settings selected to solve the problem of the comparative example in which micro lenses are formed by an inkjet printing process without using boundary lines.

As illustrated in FIG. 4, the micro lens ink in the form of droplet is ejected toward the surface of the multilayer organic/inorganic TFE system through the nozzles of an inkjet printer, and the droplets of the micro lens ink land on the surface, with a spacing therebetween corresponding to a nozzle gap "a". The droplets are isolated from each other when immediately having landed on the surface due to the nozzle gap. However, each of the droplets on the surface of the multilayer organic/inorganic TFE system starts spreading sideways due to the ejection pressure of the inkjet printer and the force of gravity after the landing. When neighboring ink droplets abut on each other due to the spreading of ink, the droplets may aggregate to form a larger droplet.

When this happens, that is, two or more droplets aggregate to form a single large micro lens, the formed micro lens has a relatively large width and a relatively small height, resulting in degradation in self-cleaning effect and reduction in the level of light absorption on the surface of the solar cell module.

To avoid this problem, as illustrated in FIG. 5, the droplets of the micro lens ink need to be jetted with a sufficient nozzle gap of "b" such that the neighboring landed droplets 210 do not abut on each other. However, when the spacing W' between the neighboring micro lenses is excessively large to prevent the landed droplets from abutting on each other, there is a problem that the density of micro lenses is lower than required. Moreover, since the width W2 and height H2 of the micro lenses are determined depending on the contact angle of the micro lens ink with respect to the surface of the multilayer organic/inorganic TFE system, there is a problem that the aspect ratio of the micro lenses is limited.

However, in the case of applying the method according to the embodiment of the present disclosure, the boundary lines restrict the spreading of the micro lens ink, and thus the bridging of the adjacent droplets can be prevented. For this reason, the embodiment of the present disclosure has the effect of reducing the spacing between the micro lenses, thereby increasing the density of the micro lenses formed on the surface of the multilayer organic/inorganic TFE system. In addition, the aspect ratio of the micro lenses can be increased by tuning the composition of the boundary line ink and the composition of the micro lens ink such that the contact angle of the micro lens ink with respect to the boundary line becomes larger than the contact angle of the micro lens ink with respect to the surface of the multilayer organic/inorganic TFE system.

Consequently, the method of the present embodiment increases both the density and aspect ratio of the micro lenses. Therefore, perovskite solar cell modules manufactured by the embodiment method have improved self-cleaning performance compared to solar cell modules in which micro lenses are formed without using boundary lines. In addition, the reflection loss of light incident on the surface of the perovskite solar cell modules manufactured by the embodiment method is reduced, and thus the power generation efficiency is increased.

A method for manufacturing a perovskite solar cell module encapsulated with a self-cleaning thin film, according to a second embodiment of the present disclosure, is similar to the method of the first embodiment in terms of involving the encapsulation process and the surface treatment process.

The encapsulation process is to coat a perovskite solar cell with an organic or inorganic film for encapsulation.

The perovskite solar cells to be encapsulated may be commonly available perovskite solar cells, and they may be even perovskite solar cells vulnerable to moisture or oxygen. A perovskite solar cell module is composed of multiple perovskite solar cells. The multiple perovskite solar cells in one module may be electrically connected by a certain electrical connection method that is not particularly limited. Any existing electrical connection method may be used to connect solar cells in various types of solar cell modules, without departing from the features of the present disclosure.

The organic and inorganic films used to prevent moisture or oxygen from penetrating into perovskite solar cells that are vulnerable to moisture are not particularly limited, and any material used in thin film encapsulation (TFE) technology for perovskite solar cells can be used. For example, a multilayer organic/inorganic TFE system in which organic and inorganic films are alternately stacked, which has been recently widely used, can be applied. Especially, a multilayer organic/inorganic TFE system in which three films are laminated in the order of an inorganic film, an organic film, and an inorganic film, may be used.

The surface treatment process is to provide a surface roughness (concavo-convex structure) for self-cleaning, to the surface of the organic or inorganic film that encapsulates the perovskite solar cell.

In the present disclosure, the first embodiment and the second embodiment are similar in that the surface treatment process features that an inkjet printing process is used for improvement in process efficiency, and the formation of boundary lines and the formation of micro lenses are sequentially performed using an inkjet printing process. However, the second embodiment differs from the first embodiment in specific details of the boundary line forming step.

Figure 6:
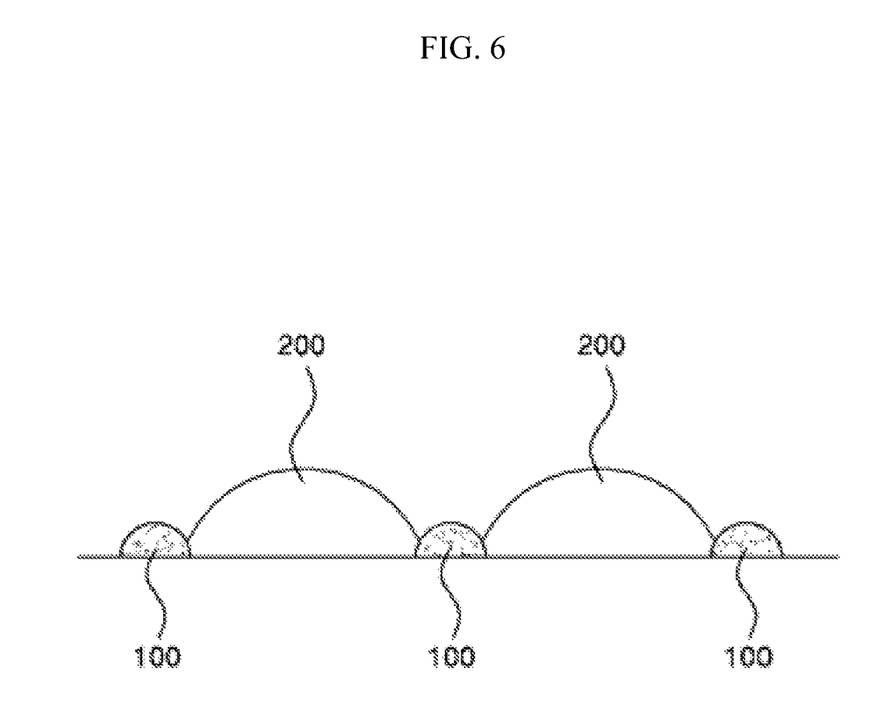
FIG. 6 is a cross-sectional view for explaining a surface structure formed through a surface treatment process involved in a method of manufacturing a perovskite solar cell module encapsulated with a self-cleaning thin film, according to a second embodiment of the present disclosure.

FIG. 6 is a cross-sectional view for explaining a surface structure formed through a surface treatment process involved in a method of manufacturing a perovskite solar cell module encapsulated with a self-cleaning thin film, according to a second embodiment of the present disclosure.

First, the boundary line forming step of the second embodiment is similar to that of the first embodiment in that boundary lines 100, which are a pattern composed of thin lines, are first drawn on the surface of an organic or inorganic film covering a perovskite solar cell, with a hydrophobic ink.

Since the pattern is formed by jetting a boundary line ink to the surface of a multilayer organic/inorganic TFE system through an inkjet printing process, this boundary forming step is similar to the step shown in FIG. 1. FIG. 1 illustrates a case where the boundary lines 100 demarcate square regions. However, the shapes of the regions demarcated by the boundary lines 100 may not be limited thereto, and regions of various shapes that can be formed by inkjet printing may be demarcated by the boundary lines 100.

In this case, since the boundary lines 100 are formed from a hydrophobic ink, the boundary lines 100 can restrict the spreading of "ink for forming micro lenses" (hereinafter, referred to as a micro lens ink), thereby defining the boundary of each micro lens. Due to this point, a dense array of micro lenses can be formed. In addition, due to the hydrophobicity of the boundary lines 100, the micro lens ink has a large contact angle when coming into contact with the boundary lines 100. This results in an effect of increasing the aspect ratio of the ink filling the inside regions of the boundary lines 100. To this end, materials such as PDMS, PTFE, epoxy, and acrylic polymers, which are polymeric materials having low surface energy, may be used as an ink material for forming the boundary lines.

The present embodiment is characterized in that a boundary line ink is ejected by inkjet printing, and then thermal reflow is applied to the ejected boundary line ink so that boundary lines 100 are transformed to have a lens-shaped cross section. In the first embodiment, the boundary lines restrict the spreading of the micro lens ink and increase the contact angle of the micro lens ink, thereby providing the self-cleaning effect and increasing the level of light absorption. However, the boundary lines have the disadvantage of reducing the level of light absorption due to the cross-sectional shape thereof. The first embodiment is intended to minimize the disadvantage by reducing the width of the boundary lines whereas the second embodiment is intended to overcome the problem that the cross section of the boundary line 100 reduces the level of light absorption by performing an additional process to modify the boundary line 100 such that the boundary line 100 has a lens-shaped cross section.

The thermal reflow is a technique of modifying polymeric films to have a lens-shaped cross section by using surface tension attributable to the micro-flowing of a material heated to above the glass transition point. In the second embodiment, the boundary lines are first drawn by jetting a boundary line ink, and then a thermal reflow process is subsequently performed under varying conditions depending on the material of the boundary lines. By the thermal reflow, the cross-section of the boundary lines 100 changes to a lens shape.

Next, a micro lens forming step is performed to form stereoscopic micro lenses 200. This step involves filling the regions surrounded by the boundary lines 100 drawn in the boundary line forming step, with "ink for micro lenses" (simply referred to as a micro lens ink).

The micro lens forming step in the second embodiment is performed in the same manner as in the first embodiment. As illustrated in FIG. 2, the regions surrounded by the boundary lines 100 drawn on the surface of the multilayer organic/inorganic TFE system 10 are filled with a micro lens ink through an inkjet printing process, and the jetted micro lens ink is then dried to form stereoscopic micro lenses 200.

Since the boundary lines 100 restrict the spreading of the ink, the formed micro lenses 200 have a three dimensional shape with a relatively small cross-sectional thickness at positions relatively near the boundary line 100 and a relatively large cross-sectional thickness at positions relatively far from the boundary line. In order for the boundary lines 100 to have the effect of restricting the spreading of the ink, the ink of the boundary lines 100 and the ink of the micro lenses must not be mixed. To this end, the micro lens forming step needs to be performed after the boundary line ink is sufficiently cured to the extent that the boundary line ink becomes immiscible with the micro lens ink that is subsequently applied. In the case where the boundary line ink and the micro lens ink are not miscible in their liquid phase due to the properties of the solvents of the respective inks, the micro lens forming step can be performed without a resting period, i.e., before the boundary line ink is completely dried. To maintain the separation between the micro lens ink and the boundary line ink, orthogonal solvents are used for the respective inks, or cross-linking materials may be mixed with the inks. On the other hand, as the contact angle of the micro lens ink with respect to the boundary lines is increased, the aspect ratio of the formed micro lenses increases. Therefore, polymeric material with low surface energy, such as PDMS, PTFE, epoxy, and acrylic polymers, can be used as a material for the micro lens ink.

The three-dimensional shape of the micro lenses 200 is intended to provide a surface roughness (concavo-convex structure) to the surface of the multilayer organic/inorganic TFE system 10, and the surface roughness has the effect of preventing dust particles or rainwater from attaching to the surface of the multilayer organic/inorganic TFE system 10. As described above, with the construction in which the surface of the multilayer organic/inorganic TFE system 10 is provided with the micro lenses 200, the multilayer organic/inorganic TFE system 10 is imparted with a self-cleaning function that makes it difficult for dust particles or rainwater to attach to the surface of the perovskite solar cell module.

The effectiveness of the self-cleaning function provided by the micro lenses 200 formed on the surface varies depending on the aspect ratio and density of the micro lenses 200. In the present embodiment, a hydrophobic ink is first used to form boundary lines 100, and the regions demarcated by the boundary lines 100 are then filled with a micro lens ink to form micro lenses 200. With the use of this two-step process, the micro lenses 200 can be highly densely formed, and the formed micro lenses 200 have a high aspect ratio representing a ratio of height to width. That is, the encapsulation with good self-cleaning performance can be realized.

When the arrangement density and aspect ratio of the micro lenses 200 are increased, the reflection loss of light incident on the surface is reduced, and a wider incident angle range of light can be utilized, resulting in increase in power generation efficiency of a perovskite solar cell module. Therefore, it is important to increase the density and aspect ratio of the micro lenses 200 formed on the surface. In the present embodiment, as illustrated in FIG. 3, since the boundary lines 100 limits the area of each micro lens 200, the density of micro lenses 200 increases with decreasing width W of the boundary lines 100. In addition, since the width W1 of the micro lenses 200 is reduced and the height H1 of the micro lenses is increased, the aspect ratio of the micro lenses 200 increase. However, when the amount of the micro lens ink supplied to the inside region surrounded by the boundary lines 100 is excessive, there is a concern that the ink overflows the boundary lines 100. Therefore, it is necessary to control the width W of the boundary lines 100 and the amount of the ink supply, depending on the contact angle of the micro lens ink with respect to the boundary lines 100.

In the case of applying the method according to the embodiment of the present disclosure, the boundary lines restrict the spreading of the micro lens ink, and thus the bridging of the adjacent droplets can be prevented. For this reason, the embodiment of the present disclosure has the effect of reducing the spacing between the micro lenses, thereby increasing the density of the micro lenses formed on the surface of the multilayer organic/inorganic TFE system. In addition, the aspect ratio of the micro lenses can be increased by tuning the composition of the boundary line ink and the composition of the micro lens ink such that the contact angle of the micro lens ink with respect to the boundary line becomes larger than the contact angle of the micro lens ink with respect to the surface of the multilayer organic/inorganic TFE system.

Consequently, the method of the present embodiment increases both the density and aspect ratio of the micro lenses. Therefore, perovskite solar cell modules manufactured by the embodiment method have improved self-cleaning performance compared to solar cell modules in which micro lenses are formed without using boundary lines. In addition, the reflection loss of light incident on the surface of the perovskite solar cell modules manufactured by the embodiment method is reduced, and thus the power generation efficiency is increased. In addition, by performing thermal reflow on the boundary lines so that the cross-section of the boundary lines can have a lens shape, a disadvantage that the boundary line reduces the level of light absorption can be overcome, and the power generation efficiency of the perovskite solar cell module can be further improved.

A method for manufacturing a perovskite solar cell module encapsulated with a self-cleaning thin film, according to a third embodiment of the present disclosure, is similar to the method of the first embodiment in terms of involving the encapsulation process and the surface treatment process.

The encapsulation process is to coat a perovskite solar cell with an organic or inorganic film for encapsulation.

The perovskite solar cells to be encapsulated may be commonly available perovskite solar cells, and they may be even perovskite solar cells vulnerable to moisture or oxygen. A perovskite solar cell module is composed of multiple perovskite solar cells. The multiple perovskite solar cells in one module may be electrically connected by a certain electrical connection method that is not particularly limited. Any existing electrical connection method may be used to connect solar cells in various types of solar cell modules, without departing from the features of the present disclosure.

The organic and inorganic films used to prevent moisture or oxygen from penetrating into perovskite solar cells that are vulnerable to moisture are not particularly limited, and any material used in thin film encapsulation (TFE) technology for perovskite solar cells can be used. For example, a multilayer organic/inorganic TFE system in which organic and inorganic films are alternately stacked, which has been recently widely used, can be applied. Especially, a multilayer organic/inorganic TFE system in which three films are laminated in the order of an inorganic film, an organic film, and an inorganic film, may be used.

The surface treatment process is to provide a surface roughness (concavo-convex structure) for self-cleaning, to the surface of the organic or inorganic film that encapsulates the perovskite solar cell.

In the present disclosure, the first embodiment and the third embodiment are similar in that the surface treatment process features that an inkjet printing process is used for improvement in process efficiency, and the formation of boundary lines and the formation of micro lenses are sequentially performed using an inkjet printing process. However, the third embodiment differs from the first embodiment in specific details of the boundary line forming step.

First, the boundary line forming step of the second embodiment is similar to that of the first embodiment in that boundary lines 100, which are a pattern composed of thin lines, are first drawn on the surface of an organic or inorganic film covering a perovskite solar cell, with a hydrophobic ink.

Since the pattern is formed by jetting a boundary line ink to the surface of a multilayer organic/inorganic TFE system through an inkjet printing process, this boundary forming step is similar to the step shown in FIG. 1. FIG. 1 illustrates a case where the boundary lines 100 demarcate square regions. However, the shapes of the regions demarcated by the boundary lines 100 may not be limited thereto, and regions of various shapes that can be formed by inkjet printing may be demarcated by the boundary lines 100.

In this case, since the boundary lines 100 are formed from a hydrophobic ink, the boundary lines 100 can restrict the spreading of "ink for forming micro lenses" (hereinafter, referred to as a micro lens ink), thereby defining the boundary of each micro lens. Due to this point, a dense array of micro lenses can be formed. In addition, due to the hydrophobicity of the boundary lines 100, the micro lens ink has a large contact angle when coming into contact with the boundary lines 100. This results in an effect of increasing the aspect ratio of the ink filling the inside regions of the boundary lines 100. To this end, materials such as PDMS, PTFE, epoxy, and acrylic polymers, which are polymeric materials having low surface energy, may be used as an ink material for forming the boundary lines.

This embodiment is characterized in that a boundary line ink is ejected by needle inkjet printing using a needle-like nozzle to form boundary lines 100 with a lens-shaped cross section, rather than using simple inkjet printing. In the first embodiment, the boundary lines restrict the spreading of the micro lens ink and increase the contact angle of the micro lens ink, thereby providing the self-cleaning effect and increasing the level of light absorption. However, the boundary lines have the disadvantage of reducing the level of light absorption due to the cross-sectional shape thereof. The first embodiment is intended to minimize the disadvantage by reducing the width of the boundary lines whereas the third embodiment is intended to overcome the problem that the boundary lines 100 reduces the level of light absorption, by using needle inkjet printing by which the boundary lines 100 are formed to have a lens-shaped cross section.

Needle inkjet printing is a technique of ejecting ink using a needle-shaped nozzle. Since ink is ejected using a needle-shaped nozzle with a small diameter and a long passage, the surface tension of the ejected ink can be easily adjusted so that the boundary line with a lens-shaped cross section can be easily formed. As a result, boundary lines 100 as shown in FIG. 6 can be obtained.

Next, a micro lens forming step is performed to form stereoscopic micro lenses 200. This step involves filling the regions surrounded by the boundary lines 100 drawn in the boundary line forming step, with "ink for micro lenses" (simply referred to as a micro lens ink).

The micro lens forming step in the third embodiment is performed in the same manner as in the first embodiment. As illustrated in FIG. 2, the regions surrounded by the boundary lines 100 drawn on the surface of the multilayer organic/inorganic TFE system 10 are filled with a micro lens ink through an inkjet printing process, and the jetted micro lens ink is then dried to form stereoscopic micro lenses 200.

Since the boundary lines 100 restrict the spreading of the ink, the formed micro lenses 200 have a three dimensional shape with a relatively small cross-sectional thickness at positions relatively near the boundary line 100 and a relatively large cross-sectional thickness at positions relatively far from the boundary line. In order for the boundary lines 100 to have the effect of restricting the spreading of the ink, the ink of the boundary lines 100 and the ink of the micro lenses must not be mixed. To this end, the micro lens forming step needs to be performed after the boundary line ink is sufficiently cured to the extent that the boundary line ink becomes immiscible with the micro lens ink that is subsequently applied. In the case where the boundary line ink and the micro lens ink are not miscible in their liquid phase due to the properties of the solvents of the respective inks, the micro lens forming step can be performed without a resting period, i.e., before the boundary line ink is completely dried. To maintain the separation between the micro lens ink and the boundary line ink, orthogonal solvents are used for the respective inks, or cross-linking materials may be mixed with the inks. On the other hand, as the contact angle of the micro lens ink with respect to the boundary lines is increased, the aspect ratio of the formed micro lenses increases. Therefore, polymeric material with low surface energy, such as PDMS, PTFE, epoxy, and acrylic polymers, can be used as a material for the micro lens ink.

The three-dimensional shape of the micro lenses 200 is intended to provide a surface roughness (concavo-convex structure) to the surface of the multilayer organic/inorganic TFE system 10, and the surface roughness has the effect of preventing dust particles or rainwater from attaching to the surface of the multilayer organic/inorganic TFE system 10. As described above, with the construction in which the surface of the multilayer organic/inorganic TFE system 10 is provided with the micro lenses 200, the multilayer organic/inorganic TFE system 10 is imparted with a self-cleaning function that makes it difficult for dust particles or rainwater to attach to the surface of the perovskite solar cell module.

The effectiveness of the self-cleaning function provided by the micro lenses 200 formed on the surface varies depending on the aspect ratio and density of the micro lenses 200. In the present embodiment, a hydrophobic ink is first used to form boundary lines 100, and the regions demarcated by the boundary lines 100 are then filled with a micro lens ink to form micro lenses 200. With the use of this two-step process, the micro lenses 200 can be highly densely formed, and the formed micro lenses 200 have a high aspect ratio representing a ratio of height to width. That is, the encapsulation with good self-cleaning performance can be realized.

When the arrangement density and aspect ratio of the micro lenses 200 are increased, the reflection loss of light incident on the surface is reduced, and a wider incident angle range of light can be utilized, resulting in increase in power generation efficiency of a perovskite solar cell module. Therefore, it is important to increase the density and aspect ratio of the micro lenses 200 formed on the surface. In the present embodiment, as illustrated in FIG. 3, since the boundary lines 100 limits the area of each micro lens 200, the density of micro lenses 200 increases with decreasing width W of the boundary lines 100. In addition, since the width W1 of the micro lenses 200 is reduced and the height H1 of the micro lenses is increased, the aspect ratio of the micro lenses 200 increase. However, when the amount of the micro lens ink supplied to the inside region surrounded by the boundary lines 100 is excessive, there is a concern that the ink overflows the boundary lines 100. Therefore, it is necessary to control the width W of the boundary lines 100 and the amount of the ink supply, depending on the contact angle of the micro lens ink with respect to the boundary lines 100.

In the case of applying the method according to the embodiment of the present disclosure, the boundary lines restrict the spreading of the micro lens ink, and thus the bridging of the adjacent droplets can be prevented. For this reason, the embodiment of the present disclosure has the effect of reducing the spacing between the micro lenses, thereby increasing the density of the micro lenses formed on the surface of the multilayer organic/inorganic TFE system. In addition, the aspect ratio of the micro lenses can be increased by tuning the composition of the boundary line ink and the composition of the micro lens ink such that the contact angle of the micro lens ink with respect to the boundary line becomes larger than the contact angle of the micro lens ink with respect to the surface of the multilayer organic/inorganic TFE system.

Consequently, the method of the present embodiment increases both the density and aspect ratio of the micro lenses. Therefore, perovskite solar cell modules manufactured by the embodiment method have improved self-cleaning performance compared to solar cell modules in which micro lenses are formed without using boundary lines. In addition, the reflection loss of light incident on the surface of the perovskite solar cell modules manufactured by the embodiment method is reduced, and thus the power generation efficiency is increased. In addition, by performing thermal reflow on the boundary lines so that the cross-section of the boundary lines can have a lens shape, a disadvantage that the boundary line reduces the level of light absorption can be overcome, and the power generation efficiency of the perovskite solar cell module can be further improved.

A method for manufacturing a perovskite solar cell module encapsulated with a self-cleaning thin film, according to a fourth embodiment of the present disclosure, is similar to the method of the first embodiment in terms of involving the encapsulation process and the surface treatment process.

The encapsulation process is to coat a perovskite solar cell with an organic or inorganic film for encapsulation.

The perovskite solar cells to be encapsulated may be commonly available perovskite solar cells, and they may be even perovskite solar cells vulnerable to moisture or oxygen. A perovskite solar cell module is composed of multiple perovskite solar cells. The multiple perovskite solar cells in one module may be electrically connected by a certain electrical connection method that is not particularly limited. Any existing electrical connection method may be used to connect solar cells in various types of solar cell modules, without departing from the features of the present disclosure.

The organic and inorganic films used to prevent moisture or oxygen from penetrating into perovskite solar cells that are vulnerable to moisture are not particularly limited, and any material used in thin film encapsulation (TFE) technology for perovskite solar cells can be used. For example, a multilayer organic/inorganic TFE system in which organic and inorganic films are alternately stacked, which has been recently widely used, can be applied. Especially, a multilayer organic/inorganic TFE system in which three films are laminated in the order of an inorganic film, an organic film, and an inorganic film, may be used.

The surface treatment process is to provide a surface roughness (concavo-convex structure) for self-cleaning, to the surface of the organic or inorganic film that encapsulates the perovskite solar cell.

In the present disclosure, the first embodiment and the fourth embodiment are similar in that the surface treatment process features that an inkjet printing process is used for improvement in process efficiency, and the formation of boundary lines and the formation of micro lenses are sequentially performed using an inkjet printing process. However, the fourth embodiment differs from the first embodiment in specific details of the micro lens forming step.

First, the boundary line forming step of the present embodiment is to draw boundary lines 100, which are a pattern composed of thin lines, on the surface of an organic or inorganic film covering a perovskite solar cell, with a hydrophobic ink. The boundary line forming step of the present embodiment is performed in the same manner as in the first embodiment and is similar to that illustrated in FIG. 1.

FIG. 1 illustrates a case where the boundary lines 100 demarcate square regions. However, the shapes of the regions demarcated by the boundary lines 100 may not be limited thereto, and regions of various shapes that can be formed by inkjet printing may be demarcated by the boundary lines 100.

In this case, since the boundary lines 100 are formed from a hydrophobic ink, the boundary lines 100 can restrict the spreading of "ink for forming micro lenses" (hereinafter, referred to as a micro lens ink), thereby defining the boundary of each micro lens. Due to this point, a dense array of micro lenses can be formed. In addition, due to the hydrophobicity of the boundary lines 100, the micro lens ink has a large contact angle when coming into contact with the boundary lines 100. This results in an effect of increasing the aspect ratio of the ink filling the inside regions of the boundary lines 100. To this end, materials such as PDMS, PTFE, epoxy, and acrylic polymers, which are polymeric materials having low surface energy, may be used as an ink material for forming the boundary lines.

Next, a micro lens forming step is performed to form stereoscopic micro lenses 200. This step of the present embodiment is the same as that of the first embodiment in that the stereoscopic micro lenses 200 are formed by filling the regions surrounded by the boundary lines 100 drawn in the boundary line forming step, with "ink for micro lenses" (simply referred to as a micro lens ink).

The regions surrounded by the boundary lines 100 drawn on the surface of the multilayer organic/inorganic TFE system 10 are filled with the micro lens ink through an inkjet printing process, and the jetted micro lens ink is then dried to form the stereoscopic micro lenses 200 in the same manner as illustrated in FIG. 2.

Since the boundary lines 100 restrict the spreading of the ink, the formed micro lenses 200 have a three dimensional shape with a relatively small cross-sectional thickness at positions relatively near the boundary line 100 and a relatively large cross-sectional thickness at positions relatively far from the boundary line. In order for the boundary lines 100 to have the effect of restricting the spreading of the ink, the ink of the boundary lines 100 and the ink of the micro lenses must not be mixed. To this end, the micro lens forming step needs to be performed after the boundary line ink is sufficiently cured to the extent that the boundary line ink becomes immiscible with the micro lens ink that is subsequently applied. In the case where the boundary line ink and the micro lens ink are not miscible in their liquid phase due to the properties of the solvents of the respective inks, the micro lens forming step can be performed without a resting period, i.e., before the boundary line ink is completely dried. To maintain the separation between the micro lens ink and the boundary line ink, orthogonal solvents are used for the respective inks, or cross-linking materials may be mixed with the inks. On the other hand, as the contact angle of the micro lens ink with respect to the boundary lines is increased, the aspect ratio of the formed micro lenses increases. Therefore, polymeric material with low surface energy, such as PDMS, PTFE, epoxy, and acrylic polymers, can be used as a material for the micro lens ink.

The three-dimensional shape of the micro lenses 200 is intended to provide a surface roughness (concavo-convex structure) to the surface of the multilayer organic/inorganic TFE system 10, and the surface roughness has the effect of preventing dust particles or rainwater from attaching to the surface of the multilayer organic/inorganic TFE system 10. As described above, with the construction in which the surface of the multilayer organic/inorganic TFE system 10 is provided with the micro lenses 200, the multilayer organic/inorganic TFE system 10 is imparted with a self-cleaning function that makes it difficult for dust particles or rainwater to attach to the surface of the perovskite solar cell module.

The effectiveness of the self-cleaning function provided by the micro lenses 200 formed on the surface varies depending on the aspect ratio and density of the micro lenses 200. In the present embodiment, a hydrophobic ink is first used to form boundary lines 100, and the regions demarcated by the boundary lines 100 are then filled with a micro lens ink to form micro lenses 200. With the use of this two-step process, the micro lenses 200 can be highly densely formed, and the formed micro lenses 200 have a high aspect ratio representing a ratio of height to width. That is, the encapsulation with good self-cleaning performance can be realized.

When the arrangement density and aspect ratio of the micro lenses 200 are increased, the reflection loss of light incident on the surface is reduced, and a wider incident angle range of light can be utilized, resulting in increase in power generation efficiency of a perovskite solar cell module. Therefore, it is important to increase the density and aspect ratio of the micro lenses 200 formed on the surface. In the present embodiment, as illustrated in FIG. 3, since the boundary lines 100 limits the area of each micro lens 200, the density of micro lenses 200 increases with decreasing width W of the boundary lines 100. In addition, since the width W1 of the micro lenses 200 is reduced and the height H1 of the micro lenses is increased, the aspect ratio of the micro lenses 200 increase. However, when the amount of the micro lens ink supplied to the inside region surrounded by the boundary lines 100 is excessive, there is a concern that the ink overflows the boundary lines 100. Therefore, it is necessary to control the width W of the boundary lines 100 and the amount of the ink supply, depending on the contact angle of the micro lens ink with respect to the boundary lines 100.

The micro lens forming step of the fourth embodiment differs from that of the first embodiment in that a preliminary drying process is involved, and the ejection of the micro lens ink is repeatedly performed to increase the aspect ratio of the micro lenses.

Figure 7:
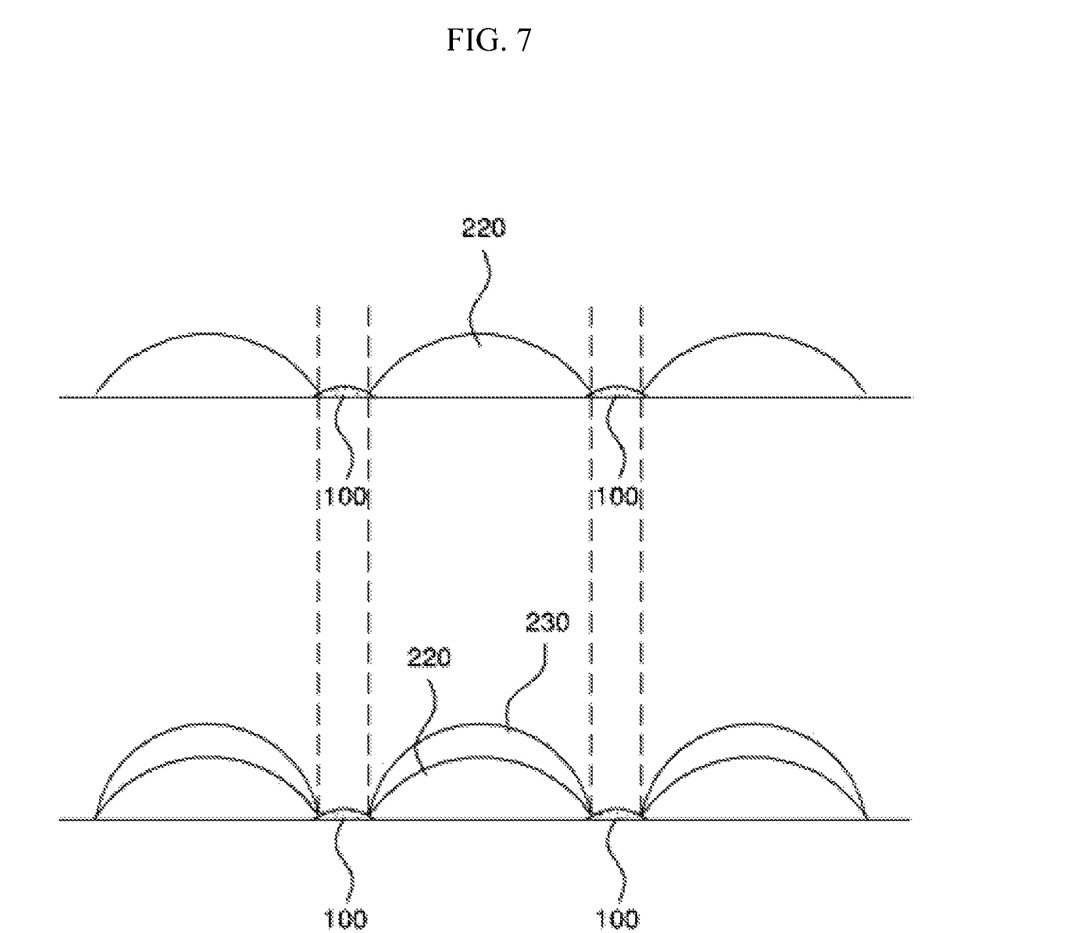
FIG. 7 is a cross-sectional view for explaining a surface structure formed through a surface treatment process involved in a method of manufacturing a perovskite solar cell module encapsulated with a self-cleaning thin film encapsulation, according to a third embodiment of the present disclosure.

FIG. 7 is a cross-sectional view for explaining a surface structure formed through a surface treatment process involved in a method of manufacturing a perovskite solar cell module encapsulated with a self-cleaning thin film encapsulation, according to a fourth embodiment of the present disclosure.

Rather than forming micro lenses through a single event of inkjet printing, in the present embodiment, primary inkjet printing is performed, then the ejected ink 220 for forming micro lenses is preliminarily dried, and secondary inkjet printing is performed so that ink 230 for forming micro lenses is applied to the surface of the preliminarily dried ink 220.

In the present embodiment, the preliminary drying is characterized in not completely drying the ink 220 ejected by the primary inkjet printing. Specifically, in the case where the micro lens ink 230 lands on the micro lens ink 220 by the secondary inkjet printing in a state in which the micro lens ink ejected by the primary inkjet printing is overly dried to have a dry skin formed on the surface thereof, the dry skin of the micro lens ink 220 breaks and the boundary of the micro lens collapses. Therefore, non-uniform micro lenses are generated. Accordingly, although lines indicating boundaries of elements are drawn for clarity in FIG. 7, preliminary drying needs to be performed such that no dry skin is actually formed on the surface of the micro lens ink 220 ejected by the primary inkjet printing. As a solvent for poly(methyl methacrylate) (PMMA), a mixed solvent, which is a mixture of a first solvent (for example, chlorobenzene) with a relatively high vapor pressure and a second solvent (for example, dibasic ester (DBE)) with a relatively low vapor pressure, may be used to increase the drying speed of the ink. The preliminary drying time can be adjusted according to the ratio of the first solvent and the second solvent. The drying time can be reduced by applying heat.

In the case of applying the method according to the embodiment of the present disclosure, the boundary lines restrict the spreading of the micro lens ink, and thus the bridging of the adjacent droplets can be prevented. For this reason, the embodiment of the present disclosure has the effect of reducing the spacing between the micro lenses, thereby increasing the density of the micro lenses formed on the surface of the multilayer organic/inorganic TFE system. In addition, the aspect ratio of the micro lenses can be increased by tuning the composition of the boundary line ink and the composition of the micro lens ink such that the contact angle of the micro lens ink with respect to the boundary line becomes larger than the contact angle of the micro lens ink with respect to the surface of the multilayer organic/inorganic TFE system. In addition, since the ink for formation of micro lenses are ejected and the preliminary drying is involved, the aspect ratio can be further increased.

A perovskite solar cell module to which either of the present embodiment is applied are provided with micro lenses that are densely arranged and which have a high aspect ratio. Therefore, the perovskite solar cell module to which one of the embodiments is applied has improved self-cleaning performance and exhibits an effect that the reflection of light incident on the surface thereof is reduced, compared to perovskite solar cell modules in which micro lenses are formed without using boundary lines. Therefore, the perovskite solar cell module to which one of the embodiments is applied has improved power conversion efficiency.

While the present invention has been described with reference to the preferred embodiments, the above-described embodiments are merely illustrative of the technical idea of the present invention, and the ordinarily skilled in the art will appreciate that various changes or modifications to the embodiments can be made without departing from the technical idea of the present invention. Therefore, it is noted that the protection scope of the present invention should be interpreted not by the specific embodiments but by the matters recited in the claims, and all technical ideas equivalent to the matters recited in the claims should be interpreted as being included in the scope of the present invention.

What is claimed is:

1. A method for manufacturing a perovskite solar cell module encapsulated with a self-cleaning thin film by using inkjet printing, the method comprising:

encapsulating by coating two outer surfaces of a perovskite solar cell with a thin film encapsulating member composed of a first inorganic film, an organic film material and a second inorganic film; and forming a surface structure providing a self-cleaning function on a surface of the thin film encapsulating member surrounding the perovskite solar cell, wherein the forming of the surface structure comprises:
  forming boundary lines by using an inkjet printing process on the surface of the thin film encapsulating member surrounding the perovskite solar cell; and
  forming micro lenses by using an inkjet printing process on the surface of the thin film encapsulating member surrounding the perovskite solar cell, the micro lenses being surrounded by the boundary lines, wherein the forming of the micro lenses comprises:
  performing primary inkjet printing by ejecting ink to regions surrounded by the boundary lines on the surface of the thin film encapsulating member surrounding the perovskite solar cell;
  preliminarily drying the ink ejected through the primary inkjet printing;
  performing secondary inkjet printing by ejecting ink to a surface of the preliminarily dried ink, wherein a drying time for the preliminarily drying is controlled by adjusting a mixing ratio of a first solvent and a second solvent that constitute a mixed solvent for the ink, and wherein the first solvent has a relatively high vapor pressure and the second solvent has a relatively low vapor pressure.

2. The method of claim 1, wherein the boundary lines and the micro lenses are made of one material among PDMS, PTFE, epoxy, and acrylic polymers.

3. The method of claim 1, wherein in the forming of the boundary lines, the boundary lines undergo a thermal reflow process so that each of the boundary lines is modified to have a lens-shaped cross section.

4. The method of claim 1, wherein in the forming of the boundary lines, each of the boundary lines is formed to have a lens-shaped cross section through an inkjet printing process using a needle-shaped nozzle.

5. The method of claim 1, wherein the preliminarily drying is performed to prevent a dry skin from being formed on the surface of the ink ejected through the primary inkjet printing.

6. A perovskite solar cell module encapsulated with a self-cleaning thin film, the perovskite solar cell module being manufactured by the method of claim 1, the perovskite solar cell module comprising:
  the perovskite solar cell;
  the thin film encapsulating member composed of the first inorganic film, the organic film material and the second inorganic film and coating said two outer surfaces of the perovskite solar cell;
  the boundary lines formed by the inkjet printing process on the surface of the thin film encapsulating member; and
  micro lenses formed by the inkjet printing process on the surface of the thin film encapsulating member, the micro lens being surrounded by the boundary lines.

7. The perovskite solar cell module of claim 6, wherein each of the boundary lines has a lens-shaped cross section.

* * * * *